(12) United States Patent
Nishijima (10) Patent No.: US 9,666,468 B2
(45) Date of Patent: May 30, 2017

(54) TRAY FOR A WAFER WITH TAPE FRAME (71) Applicant: ACHILLES CORPORATION, Tokyo (JP)

(72) Inventor: Masayuki Nishijima, Tokyo (JP)

(73) Assignee: ACHILLES CORPORATION, Tokyo (JP)

( * ) Notice: Subject to any disclaimer, the term of this patent is extended or adjusted under 35 U.S.C. 154(b) by 0 days.

(21) Appl. No.: 14/761,837

(22) PCT Filed: Feb. 7, 2014

(86) PCT No.: PCT/JP2014/052878
§ 371 (c)(1),
(2) Date: Jul. 17, 2015

(87) PCT Pub. No.: WO2014/123216
PCT Pub. Date: Aug. 14, 2014

(65) Prior Publication Data
US 2015/0380293 A1 Dec. 31, 2015

(30) Foreign Application Priority Data

Feb. 11, 2013 (JP) .................................. 2013-023926

(51) Int. Cl.
H01L 21/683 (2006.01)
H01L 21/673 (2006.01)

(52) U.S. Cl.
CPC .... H01L 21/6836 (2013.01); H01L 21/67346 (2013.01); *H01L 2221/68327* (2013.01)

(58) Field of Classification Search
CPC .. B65D 1/34; B65D 21/0209; B65D 21/0217; B65D 21/0219; B65D 21/68;
(Continued)

(56) References Cited

U.S. PATENT DOCUMENTS 6,915,906 B2 * 7/2005 Pylant ............... H01L 21/67386
206/454
7,080,675 B2 * 7/2006 Yamamoto ........ H01L 21/67132
156/538
(Continued)

FOREIGN PATENT DOCUMENTS

JP S58-158437 U 10/1983
JP H10-050815 A 2/1998
(Continued)

OTHER PUBLICATIONS

Singapore Patent Office, "Search Report for Singaporean Patent Application No. 11201505757V," Jan. 28, 2016.
(Continued)

Primary Examiner — Bryon Gehman
(74) Attorney, Agent, or Firm — Manabu Kanesaka (57) ABSTRACT A tray for storing a wafer with a tape frame in a storage container includes a ring-shaped frame, a dicing tape and a semiconductor wafer. The dicing tape is stuck on the rear surface of the ring-shaped frame, and the semiconductor wafer is supported on the dicing tape. The tray has a substantially circular shape and is positioned on the upper side and the lower side of the wafer with tape frame. The front surface of the tray has a flat portion for mounting the wafer, and at least a portion of the outer peripheral portion of the front surface of the tray includes a convex portion. A projecting portion is formed on the rear surface so that the projection portion is positioned outside the outer periphery of the semiconductor wafer of the wafer with the tape frame when the tray is positioned on the wafer with tape frame.

4 Claims, 7 Drawing Sheets (58) Field of Classification Search
CPC ........ B65D 85/00; B65D 85/30; B65D 85/48;
B65D 85/86; H01L 21/02; H01L 21/67;
H01L 21/673; H01L 21/67346; H01L
21/68; H01L 21/683; H01L 21/6836;
H01L 2221/68327
USPC ................ 206/445, 454, 455, 509, 701, 710
See application file for complete search history.

(56) References Cited

U.S. PATENT DOCUMENTS

| | | | | |
|---|---|---|---|---|
| 7,131,248 | B2* | 11/2006 | Pylant | H01L 21/67346 |
| | | | | 53/443 |
| 7,431,162 | B2* | 10/2008 | Forsyth | H01L 21/67353 |
| | | | | 206/710 |
| 7,578,392 | B2* | 8/2009 | Brooks | H01L 21/67353 |
| | | | | 206/710 |
| 7,588,150 | B2* | 9/2009 | Kasama | H01L 21/67369 |
| | | | | 206/710 |
| 7,819,252 | B2* | 10/2010 | Kasama | H01L 21/67346 |
| | | | | 206/509 |
| 7,854,327 | B2* | 12/2010 | Hyobu | H01L 21/67294 |
| | | | | 206/454 |
| 8,079,477 | B2* | 12/2011 | Kasama | H01L 21/67369 |
| | | | | 206/509 |
| 2007/0068882 | A1 | 3/2007 | Yoshizawa | |
| 2007/0187286 | A1* | 8/2007 | Pylant | H01L 21/67386 |
| | | | | 206/710 |

FOREIGN PATENT DOCUMENTS

| | | | |
|---|---|---|---|
| JP | 2000-077512 | A | 3/2000 |
| JP | 2003-168731 | A | 6/2003 |
| JP | 2005-332868 | A | 12/2005 |
| JP | 2007-234992 | A | 9/2007 |
| JP | 4562930 | B2 | 10/2010 |

OTHER PUBLICATIONS

PCT, "International Search Report for International Application No. PCT/JP2014/052878".

* cited by examiner

TRAY FOR A WAFER WITH TAPE FRAME

RELATED APPLICATIONS

The present application is National Phase of International Application No. PCT/JP2014/052878 filed Feb. 7, 2014, and claims priority from Japanese Application No. 2013-023926, filed Feb. 11, 2013, the disclosure of which is hereby incorporated by reference herein in its entirety.

TECHNICAL FIELD

The present invention relates to a tray used for storing a wafer with tape frame in a storage container.

BACKGROUND ART

Conventionally, a wafer with tape frame is formed by sticking a dicing tape on a ring-shaped frame and supporting a semiconductor wafer on the dicing tape, and the wafer with tape frame is stored in a storage container and transported to a dicing process and a die bonding process.

As a container for storing a wafer with tape frame, it is known to use a horizontal (a coin stuck type) transport container for storing a semiconductor wafer in a horizontal direction as shown in Patent Document 1, for example. More specifically, it is a container for stacking and storing two or more stages of frames with tape frame, which comprises a container body having a storage cylindrical portion for storing the stacked wafers with tape frame and a cover body for covering the entire storage cylindrical portion by attaching to the container body in a detachable manner, and a positioning rib projects from the inner peripheral surface of the storage cylindrical portion for positioning the ring-shaped frame in a circumferential direction.

It is also common to interpose a bendable synthetic resin sheet or a spacer sheet like dust-free paper between the wafers with tape frame in order to prevent vibrations and shocks during container transportation from propagating to semiconductor wafers of the wafers with tape frame.

On the other hand, recently, the development of chip integration technologies (3DS-IC: three dimension stacking IC) using Through Silicon Via (TSV) realized sophisticated, high speed and low power consumption chips and therefore it is considered as a future semiconductor technology driver.

PRIOR ART DOCUMENT

Patent Document

Patent Document 1: Japanese Patent No. 4562930

DISCLOSURE OF INVENTION

Problems to be Resolved by the Invention

For example, it is necessary to reduce the thickness of a semiconductor wafer to an ultrathin thickness like 200 µm or less in order to realize a TSV/3DS-IC structure, and therefore the breakage rate became high during handling of the ultrathin semiconductor wafer.

In a container described in Patent Document 1, swings of semiconductor wafers by vibrations of a container become large during transportation of wafers with tape frame stored in a container when the thickness of semiconductor wafers becomes 200 µm or less, and as a result, it causes a problem of breaking the semiconductor wafers.

Even if a spacer sheet is interposed between wafers with tape frame, when the thickness of semiconductor wafers becomes 200 µm or less, it is insufficient to prevent breakage of the semiconductor wafers because vibrations and shocks propagate to the semiconductor wafers during the container transportation.

The surface of a semiconductor wafer having a 3DS-IC structure has a very fine structure because micro bumps are formed on the surface and TDV terminals are exposed from the surface. As a result, it causes a problem of breaking semiconductor wafers by transferring part of the spacer sheet to the 3DS-IC structure or scratching the 3DS-IC structure by the spacer sheet when the spacer sheet directly contacts with the surface of the semiconductor wafer having a 3DS-IC structure.

The purpose of the present invention is to provide a tray for reducing swings of semiconductor wafers by vibrations of a container even when an ultrathin wafer with tape frame comprising a semiconductor wafer having a thickness of 200 µm or less is transported by being stored in a container, and for preventing breakage of a semiconductor wafer by avoiding transcriptions and scratches to the surface of the semiconductor wafer even when a semiconductor wafer having a 3DS-IC structure as a wafer with tape frame is transported by being stored in a container.

Means for Solving the Problems

In order to resolve the aforementioned problems, a tray according to the present invention is constituted as a tray for use in storing a wafer with tape frame in a storage container, the wafer with tape frame comprises a ring-shaped frame, a dicing tape and a semiconductor wafer, the dicing tape is stuck on the rear surface of the ring-shaped frame, the semiconductor wafer is supported on the dicing tape, wherein the tray is positioned on the upper side and the lower side of the wafer with tape frame and has a substantially circular shape, the front surface of the tray has a substantially flat portion for mounting the wafer with tape frame, at least a portion of the outer peripheral portion of the front surface of the tray includes a convex portion, and a projecting portion is formed on the rear surface of the tray so that the projecting portion is positioned outside the outer periphery of the semiconductor wafer of the wafer with tape frame when the tray is positioned on the wafer with tape frame.

The rear surface of the tray is inclined from a point between the projecting portion and the outer peripheral portion of the semiconductor wafer as a starting point and toward the center portion, and it is preferable to set the tilt angle $\theta$ in a range between 0.1° and 1.0°.

Effect of Invention

In a tray which is used when a wafer with tape frame is stored in a storage container according to the present invention, it is possible to reduce swings of a semiconductor wafer by vibrations of the container even when the wafer with tape frame includes an ultrathin semiconductor wafer having a thickness of 200 µm or less and it is transported by being stored in the container. It is possible to certainly prevent breakage of the semiconductor wafer by avoiding transcriptions and scratches to the surface of the semiconductor wafer even when a semiconductor wafer having a 3DS-IC structure as a wafer with tape frame is transported by being stored in the container.

Additionally, it is possible to easily evacuate the inside of the storage container and easily take out a tray from the vacuumed container by easily pulling air into the container (vacuum is easily cancelled).

Furthermore, it is possible to produce a tray according to the present invention at a high yield because the structure of a mold can enable a good resin infiltration (a high filling efficiency of melted resin) during formation by injection molding.

A MODE FOR IMPLEMENTING THE INVENTION

Embodiments of a tray according to the present invention will be described below referring to the attached drawings.

[Tray]

Figure 1:
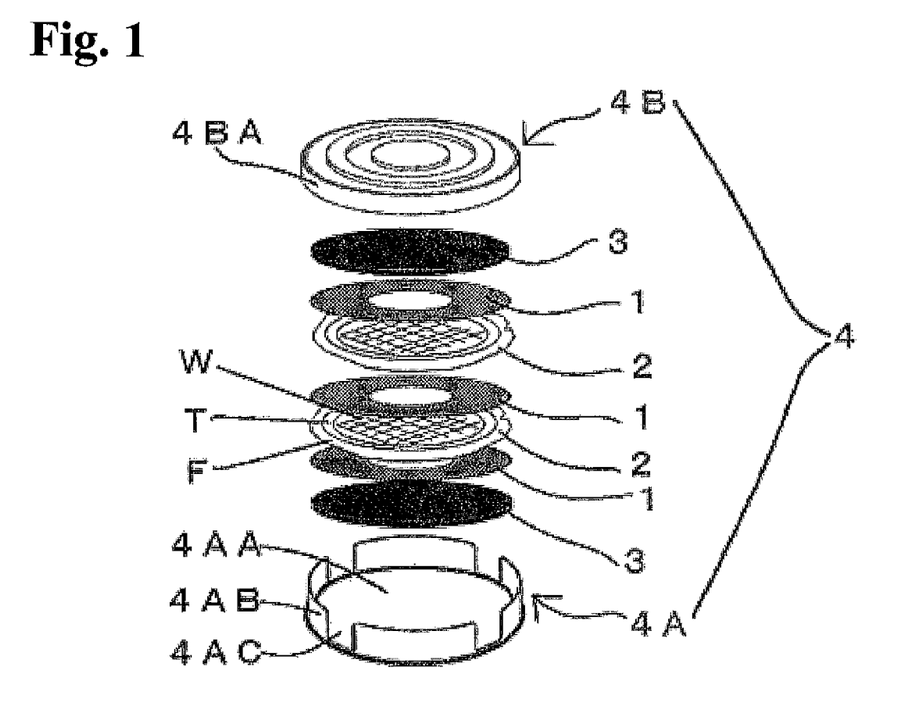
FIG. 1 is an explanatory diagram of a stored condition of a storage container.

As shown in FIG. 1, trays 1 according to an example of the present invention are laid above and below a wafer with tape frame 2 in a storage container 4 comprising a container body 4A and a cover body 4B. Even when two or more wafers with tape frame 2 are stacked, trays 1 are laid above and below the wafers with tape frame 2.

Figure 2A:
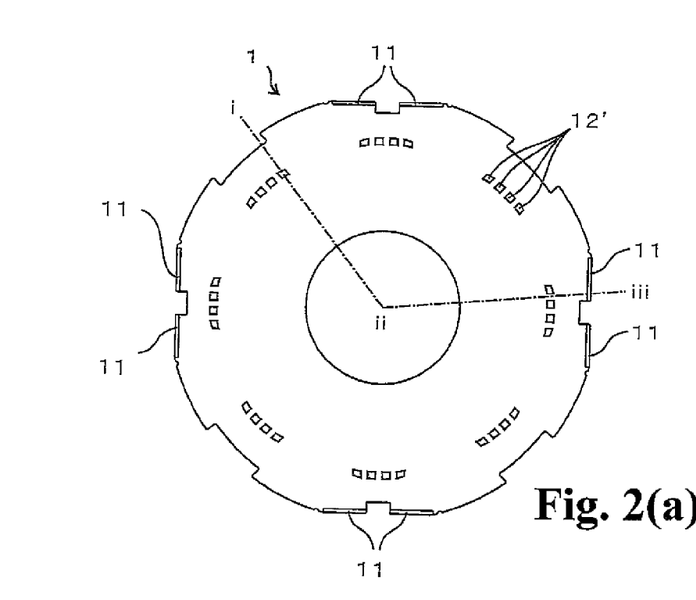
FIGS. 2(a) to 2(c) are explanatory diagrams showing examples of a tray according to the present invention; (a) shows a planner view, (b) shows a rear view, (c) shows a schematic view for explaining the cut plane along the i-ii line.
Figure 2B:
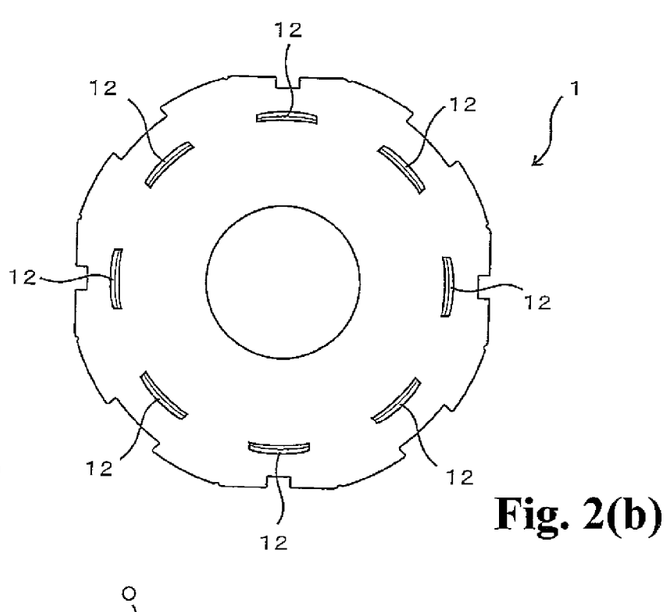

A tray 1 according to the present invention has a substantially circular shape. It may have a complete circle shape or a circular shape with cut portions partially on the outer periphery as shown in FIGS. 2 (a) and (b), for example.

FIG. 2(a) shows a planner view of a tray 1 observed from its front surface side and FIG. 2(b) shows a rear view of a tray 1 observed from its rear surface side. It is preferable to notch a portion of the outer periphery because a tray 1 can be easily caught by an automated machine or a human hand and the handling performance is improved during a storing operation of the tray 1 into the container body 4A or a removing operation of the tray 1 from the container body 4A.

Figure 3A:
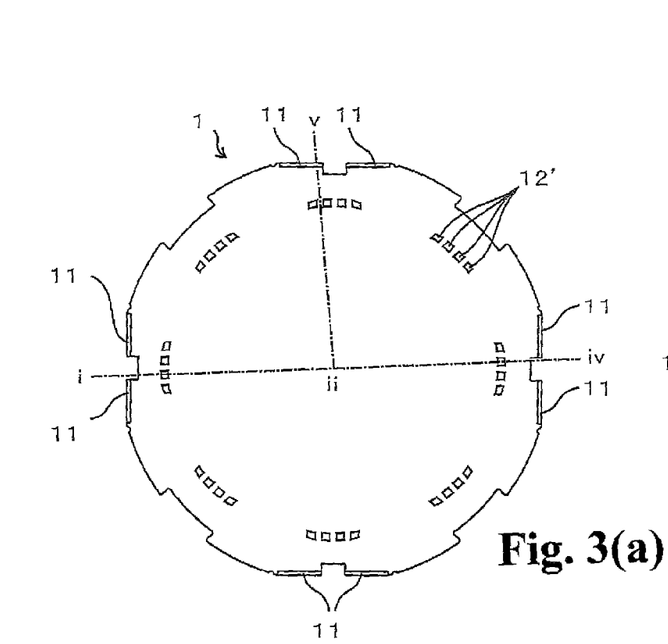
FIGS. 3(a) to 3(c) show explanatory diagrams showing another examples of a tray according to the present invention; (a) shows a planner view, (b) shows a rear view, (c) shows a schematic view for explaining the cut plane along the i-ii-iv line in (a).
Figure 3B:
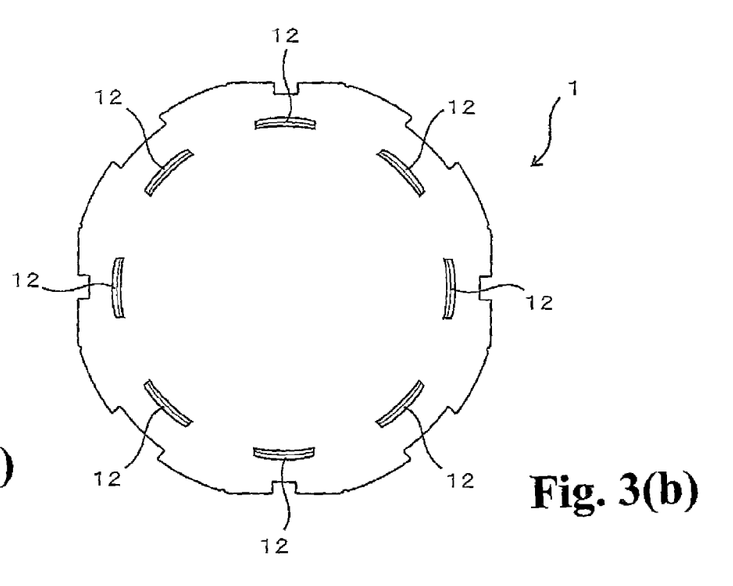

Although the tray 1 shown in FIG. 1 and FIGS. 2 (a) and (b) has a circular notched portion in its central portion, it is possible to form a tray 1 without notched portion in the central portion as shown in FIGS. 3 (a) and (b).

Figure 2C:
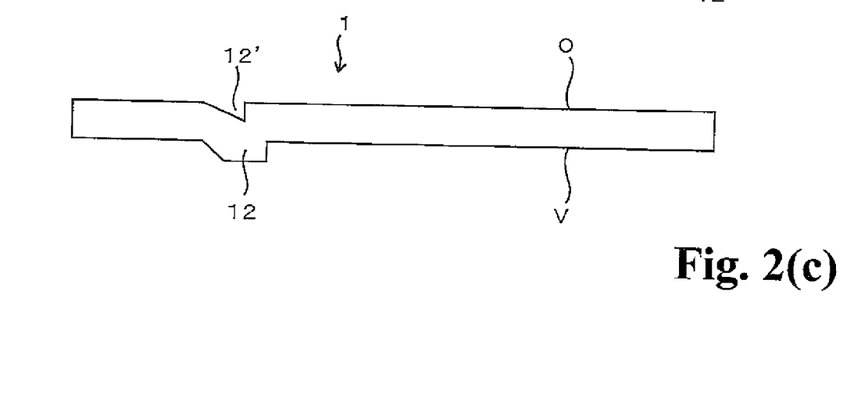
Figure 3C:
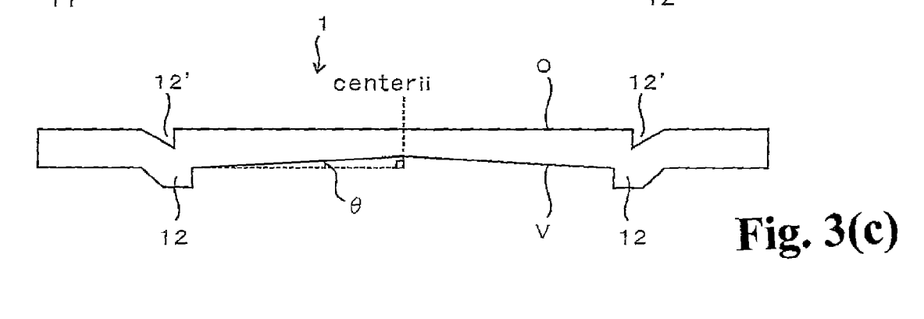

In FIG. 2(c) and FIG. 3(c), the symbol O indicates the front surface of the tray 1 and the symbol V indicates the rear surface of the tray 1.

Figure 4:
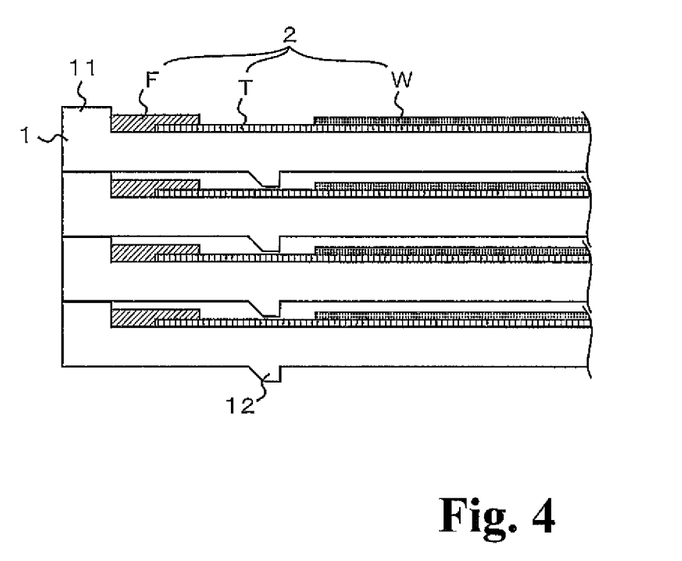
FIG. 4 shows an explanatory diagram showing an example of a condition where a tray according to the present invention and a wafer with tape frame are loaded in a storage container, and it shows a schematic view of the cut plane along the iii-ii line in FIG. 2(a).

The front surface O of the tray 1 according to the present invention has a substantially flat portion for mounting a wafer with tape frame as shown in FIG. 2(c), FIG. 3 (c) and FIG. 4, and has a convex portion 11 in at least part of the outer peripheral portion as shown in FIG. 2(a), FIG. 3 (a) and FIG. 4.

It becomes difficult for a semiconductor wafer W to swing in a downward direction by forming a substantially flat portion for mounting a wafer with tape frame 2 on the surface of the tray 1. As a result, it is possible to prevent breakage of the semiconductor wafer W because it is possible to reduce swings of the semiconductor wafer W by vibrations of the storage container 4 during transportation of the wafer with tape frame 2 stored in the storage container 4.

A rib structure may be formed on the front surface of the tray 1 as long as it does not inhibit insensitiveness of swings of the semiconductor wafer W in a downward direction.

It is also possible to prevent breakage of the semiconductor wafer W by inhibiting the horizontal movement of a ring-shaped frame F by having a convex portion 11 in at least part of the outer peripheral portion on the front surface of the tray 1. Additionally, it is possible to improve the stability of stacked trays of two or more stages in a storage container by forming convex portions 11 in at least four directions, twelve o'clock, three o'clock, six o'clock and nine o'clock as shown in FIG. 2 (a). As a result, it is possible to inhibit movement of the semiconductor wafers W of the wafers with tape frame 2 mounted on the front surface of the trays 1. It is preferable to set the height of the convex portions 11 to equal to or higher than the thickness of the ring-shaped frame F.

The convex portions 11 may be formed in part of the outer peripheral portion on the front surface of the tray 1 as shown in FIG. 2 (a) or formed along the entire outer peripheral portion on the front surface of the tray 1.

Figure 5:
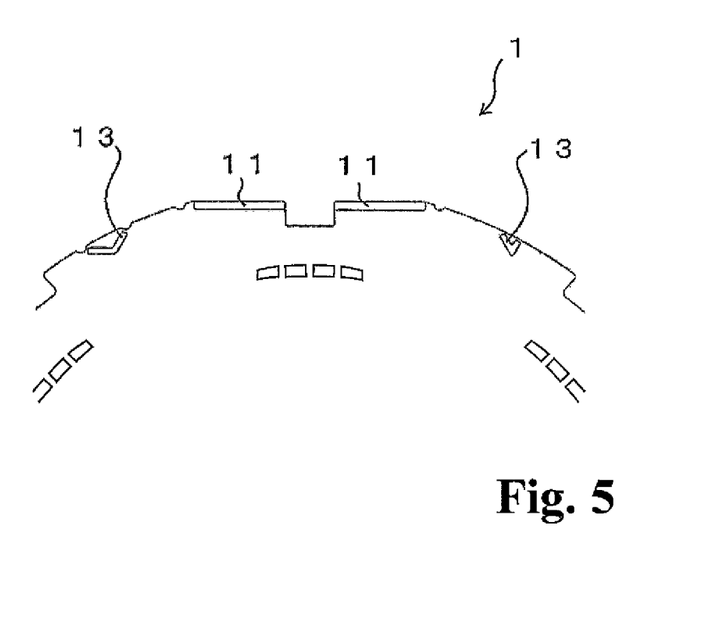
FIG. 5 shows a partial enlarged view of yet another example of a tray according to the present invention, and it is an explanatory diagram showing a guide portion formed on the surface.

FIG. 5 shows yet another example of a tray according to the present invention. In the present invention, as shown in FIG. 5, it is possible to inhibit the horizontal movement of a wafer with tape frame 2 by forming a guide portion 13 in the proximity of the outer peripheral portion on the front surface of a tray 1 for fixing the wafer with tape frame 2.

Figure 7:
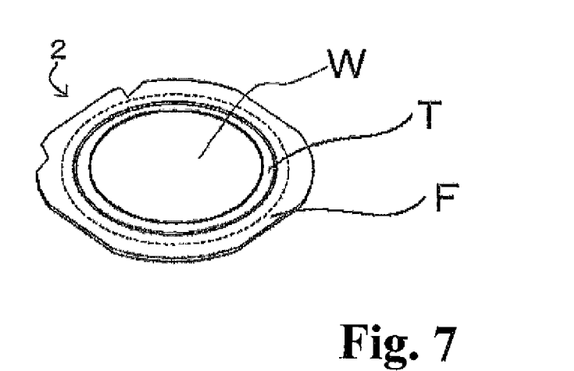
FIG. 7 is an explanatory diagram showing a wafer with tape frame.

If the guide portions 13 are formed in the shapes and positions as shown in FIG. 5, it becomes most suitable to fix a ring-shaped frame F shown in FIG. 7.

As shown in FIG. 4, on the rear surface of a tray 1 according to the present invention, a projecting portion 12 is formed so that the projecting portion 12 is positioned outside the outer periphery of the semiconductor wafer W of the wafer with tape frame 2 when the tray 1 is laid on the wafer with tape frame 2.

As a result, as shown in FIG. 4, when the tray 1 is laid on the wafer with tape frame 2, the projecting portion 12 formed on the rear surface of the tray 1 is positioned outside the outer periphery of the semiconductor wafer W. In other word, it is possible to prevent breakage of the semiconductor wafer W during transportation of the storage container 4 by inhibiting upward movement of the wafer with tape frame 2 because the projecting portion 12 of the tray 1 is positioned above the exposed portion of the dicing tape T.

Although the projecting portion 12 is positioned above the exposed portion of the dicing tape T, the projecting portion 12 of the tray 1 may contact with the exposed portion of the dicing tape T as long as the projecting portion 12 is not strongly adhered to the dicing tape T by an adhesive agent and it is not difficult to detach the tray 1 from the dicing tape T when the tray 1 is taken out from the storage container 4.

The projecting portion 12 formed on the rear surface of the tray 1 according to the present invention can have a circular arc rectangular shape as shown in FIG. 2(*b*) or a ring-shape.

The cross-sectional shape of the projecting portion 12 can be a trapezoidal shape as shown in FIG. 2(*c*), a triangular shape, a rectangular shape or a semicircular shape (a dot shape).

It is preferable to form the cross-sectional shape of the projecting portion 12 as a trapezoidal shape, because it can inhibit more effectively upward movement of the wafer with tape frame 2 by having the tip portion of the projecting portion 12 contact with the exposed portion of the dicing tape T by "plane" as shown in FIG. 2(*c*).

When the tip portion of the projecting portion 12 positioned above the exposed portion of the dicing tape T has a planer shape, the plane may include a V-shaped convex portion, a V-shaped concave portion, a semicircular convex portion or a semicircular concave portion, and then it becomes easier to vacuum the storage container 4 which stores wafers with tape frame 2 and trays 1. As a result, it also inhibits upward movement of the wafer with tape frame 2, and it becomes easier to detach the tray 1 from the dicing tape T when the tray 1 is taken out from the storage container 4 even if the projecting portion 12 is contacted with the adhesive agent of the dicing tape T.

It is possible to inhibit swings of the dicing tape T more effectively, and it is also possible to achieve yet better resin spreading during injection molding by forming recesses 12' in an area on the front surface O of the tray 1 which corresponds to the position of the projecting portion 12 as shown in FIG. 2 (*a*). FIG. 2 (*a*) shows an example where four recesses 12' are formed for each projecting portion 12.

It is possible to put the upper surface of the semiconductor wafer W in a non-contacted condition during transportation of the semiconductor wafer W having a 3DS-IC structure while being stored in the storage container 4, and therefore it is possible to prevent breakage of the semiconductor wafer W by inhibiting transcriptions and scratches to the semiconductor wafer W having a 3DS-IC structure because an air gap (a clearance) can be formed between the upper surface of the semiconductor wafer W and the tray 1 as shown in FIG. 4 by forming the convex portion 11 and the projecting portion 12 on the tray 1 as described above.

Figure 6A:
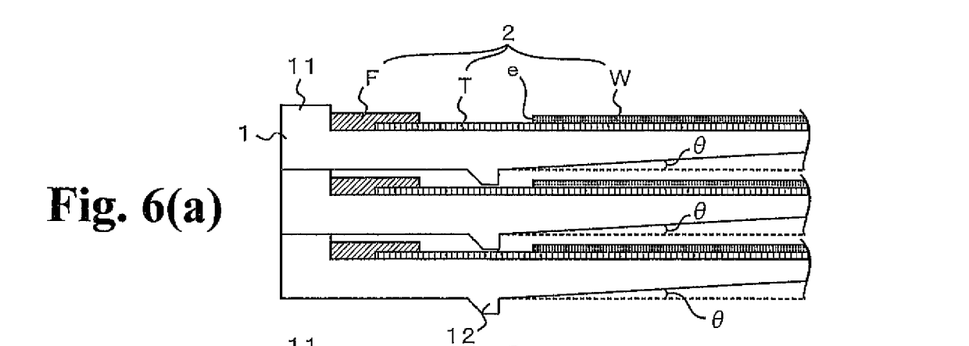
FIGS. 6(a) to 6(c) are explanatory diagrams showing another examples of a condition where a tray according to the present invention and a wafer with tape frame are loaded in a storage container, and it shows a schematic view of the cut plane along the v-ii line in FIG. 3(a).
Figure 6B:
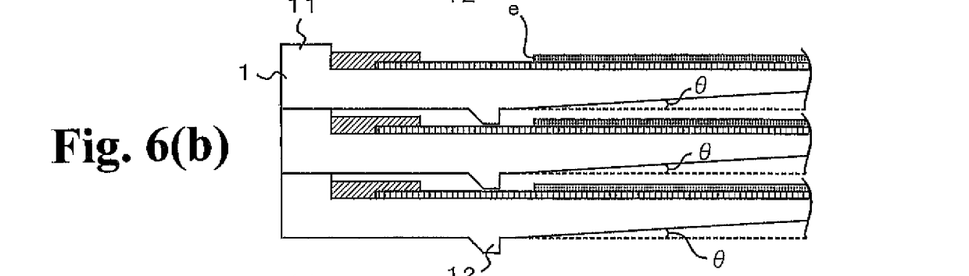
Figure 6C:
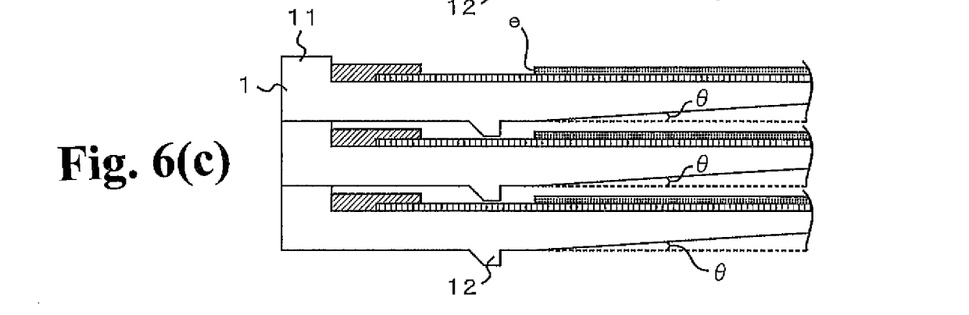

According to the present invention, as shown in FIG. 3 and FIG. 6 (*a*) through (*c*), it is possible to make the rear surface V of the tray inclined toward the center portion "ii" and starting from a point between the projecting portion 12 and the outer peripheral portion "e" of the semiconductor wafer W. If the rear surface V of the tray 1 is inclined toward the center portion "ii", it is possible to securely prevent scratches and transcriptions to the wafer surface even when an ultrathin wafer W having a thickness of 200 μm or less swings upward. Additionally, it is easier to take out a tray 1 from a vacuum packed container because it is easy to take air into the inclined rear surface (easy for vacuum cancellation), and the resin spreading (the filling efficiency of melted resin) is improved during injection molding in comparison with a non-inclined (flat) tray.

It is preferable to set the tilt angle θ to a range between 0.1° and 1.0°, and more preferably the tilt angle θ is set to a range between 0.4° and 0.5°, because the above mentioned effects cannot be obtained if the tilt angle θ is too large or too small.

It is also possible to form a rib structure on the rear surface of the tray 1 as long as neither scratch nor transcription is made on the wafer surface.

A tray 1 according to the present invention can be formed by injection molding, vacuum forming or pressure forming of synthetic resin. As synthetic resin, it is possible to use polypropylene series resin, polystyrene series resin, ABS series resin, polycarbonate series resin, polyacetal series resin, polyphenylene ester series resin, polyethernitrile series resin, polyphenylene sulfide series resin, polyphthale amide series resin, polyarylate series resin, polysulphone series resin, polyetersulphone series resin, polyeter imide series resin, liquid crystal polymer series resin, polyetheretherketone series resin, etc.

It is also possible to set the surface resistance value of a tray to a range between $10^1$ and $10^{12}\Omega$ by adding conductive fillers or an anti-electrostatic agent to synthetic resin or applying a conductive process to the tray surface after molding. As conductive fillers, it is possible to use carbon black, graphite carbon, graphite, carbon fiber, metal powder, metal fiber, metal oxide powder, metal coated inorganic fine powder, metal coated organic fine powder, and metal coated fiber.

As a conductive process, it is possible to form a conductive polymer polymerized film directly on a molded tray surface or coat paints containing conductive polymer and binder resin on a molded tray.

[Wafer with Tape Frame]

A wafer with tape frame 2 is made by sticking a dicing tape T to the rear surface of a ring-shaped frame F and supporting a semiconductor wafer W on the dicing tape T so that it is positioned inside the ring-shaped frame F as shown in FIG. 7. The dotted line in FIG. 7 indicates that the dicing tape T is stuck to the rear surface of the ring-shaped frame F.

[Ring-Shaped Frame]

A ring-shaped frame F is used to set a semiconductor wafer W to a dicing process machine (not shown in drawings) by positioning the semiconductor wafer W in a pre-determined direction. The ring-shaped frame F is obtained by punching a stainless steel plate of a thickness between 1 mm and 3 mm to form a rig-shaped plate having a center hole, and the inner diameter of the center hole is set to accommodate a wafer of a diameter of 5 inches, 6 inches, 8 inches, 12 inches or 18 inches within the center hole.

[Dicing Tape]

The rear surface of a ring-shaped frame F is stuck to a dicing tape T, and a semiconductor wafer W is supported on the dicing tape T so that it is positioned inner side of the ring-shaped frame F. The dicing tape T has at least a base member and an adhesive layer. The adhesive layer is formed on the side for contacting with the ring-shaped frame F and the semiconductor wafer W.

[Semiconductor Wafer]

A semiconductor wafer W may be formed by various materials like silicon, GaAs(Gallium Arsenic), GaP(Gallium Phosphorus), etc. The semiconductor wafer W is produced by grinding the surface of the both sides, polishing the surface of at least one side to a mirror surface and forming a circuit pattern on the polished side. Alternatively, the semiconductor wafer may have circuit patterns on the both sides.

[Storage Container]

As shown in FIG. 1, a storage container 4 has a short cylindrical profile having a substantially circular shaped bottom face when a cover body 4B is attached to a container body 4A. Alternatively, a storage container 4 may have a short prismatic profile having a substantially square shaped bottom face when a cover body 4B is attached to a container body 4A as shown in Japanese patent No. 4562930.

The container body 4A and the cover body 4B are monolithic molded by injection molding using conductive plastics with conductive fillers or an antistatic agent added, or polymer alloying treated conductive plastics as materials. As the added conductive fillers, it is possible to use carbon black, graphite carbon, graphite, carbon fiber, metal powder, metal fiber, metal oxide powder, metal coated inorganic fine powder, metal coated organic fine powder and metal coated fiber.

A dicing tape T is stuck to the rear surface of a ring-shaped frame F, and a semiconductor wafer W is supported on the dicing tape to form a wafer with tape frame 2. The wafer with tape frame 2 is stored in a container body 4A, and a cover body 4B is attached to the container body 4A to form a storage container 4 for storing and transporting the wafer with tape frame 2.

When two or more stages of wafers with tape frame are staked and stored in the storage container 4, as shown in FIG. 1, first of all, a cushion member 3 like an antistatic cushion sheet is put in the container body 4A, a tray 1 is put on the cushion sheet 3 so that the rear surface of the tray 1 faces the cushion sheet 3, and a wafer with tape frame 2 is stored. Next, a tray 1 is put on the wafer with tape frame 2 so that the rear surface of the tray 1 faces the lower wafer with tape frame 2, and then a stack of a wafer with tape frame 2 and a tray 1 are stored repeatedly in a similar fashion, a cushion member 3 is positioned on the topmost tray 1, and the cover body 4B is attached to the container body 4A.

The cover body 4B may be firmly fixed to the container body 4A using metal fitting after attaching the cover body 4B to the container body 4A by attaching metal fitting (not shown in drawings) to the notched part formed in the container body 4A.

[Container Body]

A container body 4A has a substantially circular shaped base portion 4AA as shown in FIG. 1, and a storage cylindrical portion 4AB is integrally formed on the base portion 4AA to project from the base portion 4AA. For example, four notched parts 4AC are formed in the storage cylindrical portion 4AB so that the notched parts 4AC can grip the outer periphery of the wafer with tape frame 2. Each notched part 4AC is formed with a predetermined width from the end portion of the storage cylindrical portion 4AB toward the base portion 4AA and arranged at equal intervals in a circumferential direction of the storage cylindrical portion 4AB.

[Cover Body]

The cover body 4B has a cylindrical portion 4BA which covers the outer periphery of the storage cylindrical portion 4AB by fitting to the outer peripheral surface of the storage cylindrical portion 4AB of the container body 4A.

[Cushion Member]

It is preferable to position cushion members 3 at the upper and lower ends of the stacked trays 1 and wafers with tape frame 2 in the container body 4A and it is possible to inhibit addition of vibrations and shocks to the trays 1 and the wafers with tape frame 2. As material of the cushion member, it is possible to use soft polyurethane form, polyethylene form, polypropylene form, polystyrene form, etc.

The cushion members at the ends can be conductive, and it is preferable to set the surface resistance to $10^{12}\Omega$ or less.

Embodiment

[Production of a Tray]

A tray having a shape shown in FIG. 2 (Embodiment 1) and a tray having a shape shown in FIG. 3 (Embodiment 2) were obtained by injection molding of polycarbonate resin containing carbon fiber ("Panlite B-7115R" made by Teijin Chemicals Ltd.: the content ratio of carbon fiber is about 15%). The surface resistances of the obtained trays were in a range between $10^2\Omega$ and $10^5\Omega$.

Drop tests and transcription tests were performed for the obtained trays according to Embodiments 1 and 2. The test methods were as follows.

[Drop Test]

A storage container 4 (a columnar shaped storage container of 430 mm in outer diameter×74 mm in height) was prepared by storing a cushion member 3, a tray 1, a wafer with tape frame 2, a tray 1, and then a stack of a wafer with tape frame 2 and a tray 1 repeatedly in the container body 4A shown in FIG. 1, and putting a cushion member 3 on the topmost tray 1, and attaching the cover body 4B to the container body 4A. Eight trays 1 and seven wafers with tape frame 2 were stored in the storage container 4 in total. The storage container 4 was wrapped using two shock absorbers ("PP Packing" made by Achilles Corporation: ND-12PP), and the wrapped storage container was put into a cardboard box (a rectangular shaped cardboard box of external dimensions: 550 mm in length×550 mm in width×185 mm in height).

Next, a drop test was performed on the cardboard box including the storage container 4 and the two shock absorbers complying with ISO2248. Specifically, a free fall (falling direction: 1 edge 3 ridge line 6 plane) of the cardboard box was performed from a height of 80 cm and 100 cm using a drop test device (DTS-100 made by Shinyei Technology Co., Ltd.), and then all wafers with tape frame 2 were taken out from the storage container 4 and the conditions of the semiconductor wafers W of the wafers with tape frame 2 were observed visually.

As a result, in either a storage container using a tray according to Embodiment 1 or a storage container using a tray according to Embodiment 2, neither breakage nor scratch was found in any of the wafers W. By observations using a laser microscope (VK-8500 made by Keyence Corporation), fine scratches were found along the center circular notched portion in some wafers W in Embodiment 1, and no scratch was found in any of the wafers W in Embodiment 2.

[Transcription Test]

A cushion member 3, a tray 1, a wafer with tape frame 2, a tray 1, a tray 1, a wafer with tape frame 2, . . . , a tray 1 and a cushion member 3 were stored in a container body 4A shown in FIG. 1 in this order, a cover body 4B was attached to the container body 4A. The storage container 4 was kept in this condition for six months and all wafers with tape frames 2 were taken out from the storage container 4 and the surface of the semiconductor wafers W of the wafers of tape frame 2 were observed using a laser microscope (VK-8500 made by Keyence Corporation).

As a result, neither breakage by transcription nor scratch was found in any surface of the semiconductor wafers W in either a storage container using trays according to Embodiment 1 or a storage container using trays according to Embodiment 2. Adhesion of dusts was found in the inside of the central circular notched portion on the surface of the wafer W only at the uppermost stage in Embodiment 1, and no adhesion of dusts was found in Embodiment 2.

EXPLANATION OF THE REFERENCE NUMBERS

1: tray
11: convex portion
12: projecting portion
12': recess
13: guide portion
2: wafer with tape frame
3: cushion member
4: container
4A: container body
4AA: base portion
4AB: storage cylindrical portion
4AC: notched portion
4B: cover body
4BA: cylindrical portion
W: semiconductor wafer
F: ring-shaped frame
T: dicing tape
O: front surface side of tray
V: rear surface side of tray
e: outer peripheral portion of wafer
θ: tilt angle

The invention claimed is:

1. A combination comprising a tray and a wafer stored in the tray, which are retained in a storage container,
the wafer comprising:
a ring-shaped frame,
a dicing tape stuck on a rear surface of the ring-shaped frame, and
a semiconductor wafer supported on the dicing tape inside the ring-shaped frame to have a space between the semiconductor wafer and the ring-shaped frame, and the tray comprising:
a substantially circular shape, a substantially flat upper portion and a plurality of convex portions at least at a portion of an outer peripheral portion of an upper surface of the tray, the tray further comprising a plurality of projecting portions formed under the tray so that, when the tray is aligned on top of another tray and wafer combination of substantially the same configuration, the plurality of projecting portions is positioned on the dicing tape of the another tray in the space between the semiconductor wafer of the another tray and the ring-shaped frame of the another tray to thereby suppress an upward movement of the semiconductor wafer of the another tray.

2. The combination according to claim 1, wherein a rear surface of the tray is inclined from a point between the projecting portions and an outer peripheral portion of the semiconductor wafer as a starting point and toward a center portion of the tray, a tilt angle θ is set in a range between $0.1°$ and $1.0°$.

3. The combination according to claim 1, wherein the convex portions of the another tray contact the ring-shaped frame of the wafer on the tray.

4. The combination according to claim 1, wherein the tray includes a plurality of cut portion formed partially on an outer periphery of the tray, guide portions at the outer periphery of the tray for fixing the wafer on the tray, and recesses in the upper surface of the tray at portions opposite to the projecting portions to prevent movement of the dicing tape.

* * * * *